United States Patent
Jiang et al.

(10) Patent No.: US 10,095,132 B2
(45) Date of Patent: Oct. 9, 2018

(54) MASK TRANSMISSION DEVICE AND TRANSMISSION METHOD

(71) Applicant: SHANGHAI MICRO ELECTRONICS EQUIPMENT (GROUP) CO., LTD., Shanghai (CN)

(72) Inventors: Xiaoyu Jiang, Shanghai (CN); Changgang Wang, Shanghai (CN)

(73) Assignee: SHANGHAI MICRO ELECTRONICS EQUIPMENT (GROUP)CO., LTD., Shanghai (CN)

( * ) Notice: Subject to any disclaimer, the term of this patent is extended or adjusted under 35 U.S.C. 154(b) by 0 days.

(21) Appl. No.: 15/554,184

(22) PCT Filed: Feb. 24, 2016

(86) PCT No.: PCT/CN2016/074407
§ 371 (c)(1),
(2) Date: Aug. 28, 2017

(87) PCT Pub. No.: WO2016/134654
PCT Pub. Date: Sep. 1, 2016

(65) Prior Publication Data
US 2018/0039192 A1 Feb. 8, 2018

(30) Foreign Application Priority Data
Feb. 26, 2015 (CN) .......................... 2015 1 0087602

(51) Int. Cl.
*G03B 27/62* (2006.01)
*G03F 9/00* (2006.01)

(52) U.S. Cl.
CPC ................................. *G03F 9/7073* (2013.01)

(58) Field of Classification Search
CPC ...... G03F 7/20; G03F 9/7073; G03F 7/70716; G03F 7/70741; G03F 7/70775; G03F 9/00; H01L 21/67742; G01B 11/272
See application file for complete search history.

(56) References Cited

U.S. PATENT DOCUMENTS 3,569,718 A * 3/1971 Borner ..................... G03F 7/707
250/237 R
4,252,442 A * 2/1981 Dandliker ............. G03F 9/7049
250/548

(Continued)

FOREIGN PATENT DOCUMENTS

CN 1180180 A 4/1998
CN 101067727 A1 11/2007

(Continued)

*Primary Examiner* — Deoram Persaud
(74) *Attorney, Agent, or Firm* — Muncy, Geissler, Olds & Lowe, P.C.

(57) ABSTRACT

A reticle transfer apparatus includes a reticle, a reticle stage (4) and a robot (2). The robot (2) is configured to support, transport and transfer the reticle onto the reticle stage (4). The apparatus further includes: a first set of marks (52) and a second set of marks (53), both provided on the reticle; a pre-alignment unit (3), disposed on one side of the reticle stage (4) and configured to perform a first pre-alignment process by detecting the first set of marks (52) and perform a second pre-alignment process by detecting the second set of marks (53) during the transfer of the reticle; and a control unit, configured to adjust the position of the reticle relative to the reticle stage (4) based on the results of the first pre-alignment process such that the reticle is prevented from colliding with the reticle stage (4) and to adjust the position of the reticle relative to the reticle stage (4) based on the results of the second pre-alignment process such that the reticle is positioned in a predetermined range relative to the reticle stage (4). A reticle transfer method is also disclosed.

6 Claims, 4 Drawing Sheets

(56) References Cited

U.S. PATENT DOCUMENTS

| | | | | |
|---|---|---|---|---|
| 4,620,785 | A * | 11/1986 | Suzuki | G03F 9/7084 |
| | | | | 355/43 |
| 5,194,743 | A * | 3/1993 | Aoyama | G03F 7/70716 |
| | | | | 250/548 |
| 5,812,271 | A * | 9/1998 | Kim | G03F 9/70 |
| | | | | 356/401 |
| 6,190,807 | B1 * | 2/2001 | Wang | G03F 7/70433 |
| | | | | 430/22 |
| 6,366,830 | B2 * | 4/2002 | Bacchi | B25J 9/042 |
| | | | | 414/217 |
| 9,798,167 | B2 * | 10/2017 | Deng | G02F 1/1303 |
| 2003/0218728 | A1 * | 11/2003 | del Puerto | B82Y 10/00 |
| | | | | 355/51 |
| 2007/0127026 | A1 | 6/2007 | Kusumoto | |
| 2007/0177120 | A1 * | 8/2007 | Kim | G03F 9/7011 |
| | | | | 355/55 |
| 2014/0168627 | A1 * | 6/2014 | Schmitt-Weaver | G03F 7/707 |
| | | | | 355/77 |

FOREIGN PATENT DOCUMENTS

| | | |
|---|---|---|
| CN | 102156393 A | 8/2011 |
| CN | 103984208 A | 8/2014 |
| JP | 022104 A | 1/1990 |
| JP | 08250410 A | 9/1996 |
| JP | 2005340315 A * | 12/2005 |

* cited by examiner

MASK TRANSMISSION DEVICE AND TRANSMISSION METHOD

TECHNICAL FIELD

The present invention relates to the manufacture of integrated circuit (IC) fabrication equipment and, in particular, to a method for pre-aligning a reticle.

BACKGROUND

A photolithographic tool is a device that exposes a reticle pattern onto a silicon or glass substrate, in which a reticle transfer system is a critical component responsible for transfer of a reticle between a reticle stage in an exposure unit and a reticle interface (reticle cassette).

The reticle transfer system functions essentially to transfer an unexposed reticle from the reticle cassette onto the reticle stage and the exposed reticle from the reticle stage back to the reticle cassette while ensuring that in these courses reticle marks in the reticle stage are maintained within a range that allows the marks to be captured by an alignment system.

In operation of the reticle transfer system, a reticle carrier is caused to move upward to a reticle cassette transfer position where the reticle cassette is opened to allow a robot to pick up a reticle therefrom. The robot then carries the reticle to a position at which it performs pre-alignment with the aid of a pre-alignment unit so that the reticle held by the robot is properly adjusted with respect to a reticle stage in terms of position. Thereafter, the reticle is placed on the reticle stage.

Conventionally, reticle supports arranged on a reticle stage are so spaced apart from one another that, during the pre-alignment of the reticle held by the robot, they are close to a pellicle frame attached to the reticle which is partially located within a space defined by them. If the reticle held by the robot is tilted at an excessive angle with respect to the reticle stage, it is likely for the pellicle frame to collide with the reticle supports. As a consequence, the pellicle frame may be damaged and the reticle may thus be contaminated and scrapped.

SUMMARY OF THE INVENTION

In order to overcome the above drawbacks of the prior art, disclosed in the present invention is a reticle transfer apparatus, comprising a reticle, a reticle stage and a robot, the robot configured to support, transport and transfer the reticle onto the reticle stage, wherein the apparatus further comprises: a first set of marks and a second set of marks, both provided on the reticle; a pre-alignment unit, disposed on one side of the reticle stage and configured to perform a first pre-alignment process by detecting the first set of marks and perform a second pre-alignment process by detecting the second set of marks during the transfer of the reticle; and a control unit, configured to adjust a position of the reticle relative to the reticle stage based on results of the first pre-alignment process such that the reticle is prevented from colliding with the reticle stage and to adjust a further position of the reticle relative to the reticle stage based on results of the second pre-alignment process such that the reticle is positioned in a predetermined range relative to the reticle stage.

Preferably, the reticle is provided with a pellicle frame, the reticle stage comprises reticle supports, and the control unit adjusts the position of the reticle relative to the reticle stage based on the results of the first pre-alignment process such that the pellicle frame of the reticle is prevented from colliding with the reticle supports of the reticle stage.

Preferably, the first set of marks is formed at two adjacent ones of four corners of the reticle, with the second set of marks formed at remaining two adjacent ones of the four corners of the reticle.

Also disclosed in the present invention is a reticle transfer method, comprising the steps of:

1) providing a reticle with a first set of marks and a second set of marks and moving the reticle so that it is located under a pre-alignment unit, wherein the pre-alignment unit is disposed on one side of a reticle stage;

2) performing, by the pre-alignment unit, a first pre-alignment process by detecting the first set of marks;

3) adjusting, by a control unit, a position of the reticle relative to the reticle stage based on results of the first pre-alignment process such that the reticle is prevented from colliding with the reticle stage;

4) further moving the reticle and performing, by the pre-alignment unit, a second pre-alignment process by detecting the second set of marks; and 5) adjusting, by the control unit, a further position of the reticle relative to the reticle stage based on results of the second pre-alignment process such that the reticle is positioned in a predetermined range relative to the reticle stage.

Preferably, the reticle is provided with a pellicle frame, the reticle stage comprises reticle supports, and in step 3) the control unit adjusts the position of the reticle relative to the reticle stage based on the results of the first pre-alignment process such that the pellicle frame of the reticle is prevented from colliding with the reticle supports of the reticle stage.

Preferably, the first set of marks is formed at two adjacent ones of four corners of the reticle, with the second set of marks formed at remaining two adjacent ones of the four corners of the reticle.

Compared to the prior art, the present invention can prevent the pellicle frame of the reticle from colliding with the reticle supports of the reticle stage during the transfer of the reticle to the reticle stage by the robot, i.e., providing protection to the reticle, and also allows higher transfer accuracy.

BRIEF DESCRIPTION OF THE DRAWINGS

The advantages and spirit of the present invention can be further understood from the following detail description and from the accompanying drawings.

DETAILED DESCRIPTION

Specific embodiments of the present invention will be described in detail below with reference to the accompanying drawings.

Figure 1A:
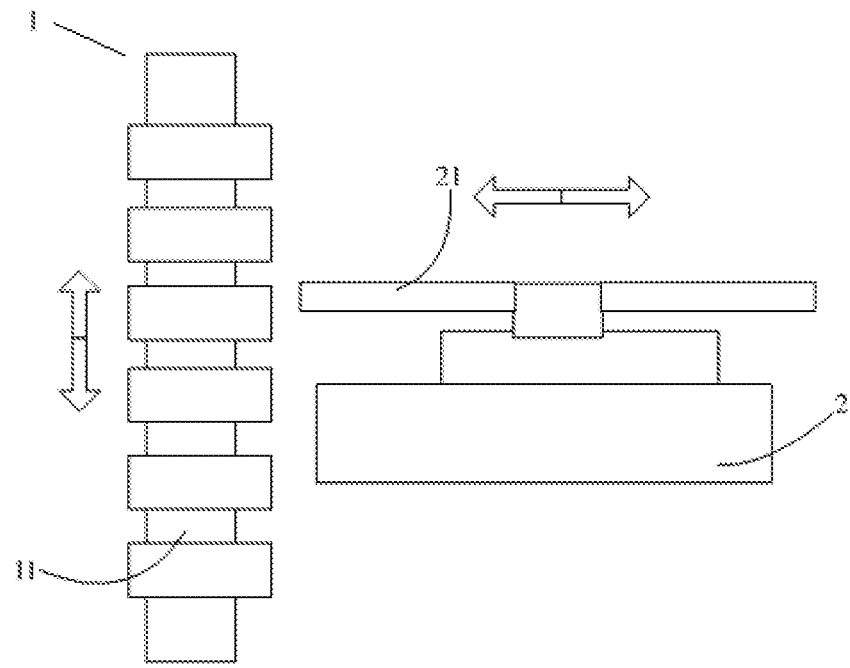
FIGS. 1A and 1B are respectively front and top views of a reticle transfer apparatus.
Figure 1B:
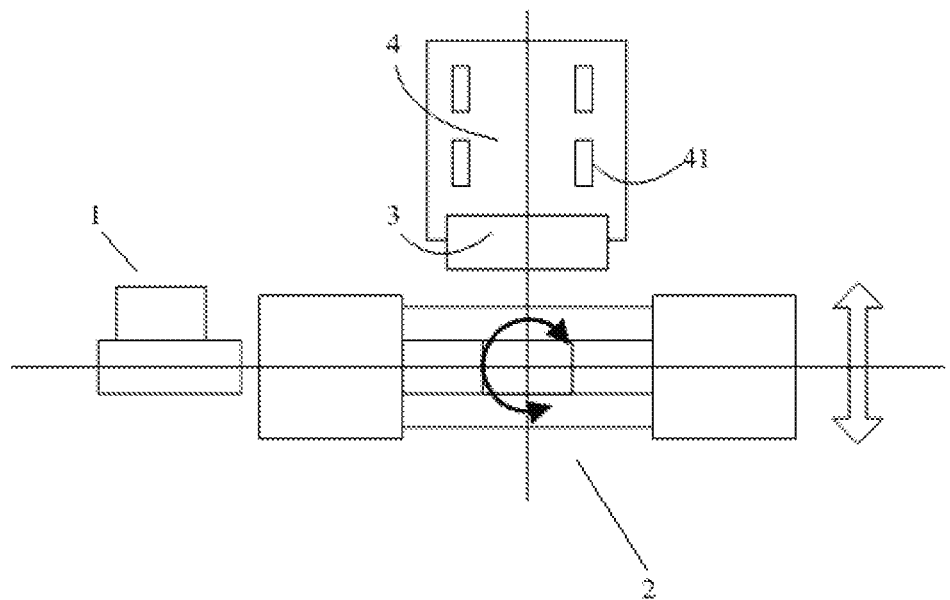

FIGS. 1A and 1B are structural schematics of a reticle transfer apparatus. As shown in these figures, the reticle transfer apparatus includes a reticle carrier 1, a robot 2 and a pre-alignment unit 3. In the reticle carrier 1, multiple reticle cassettes are stacked and can be driven by a vertical motion component 11 so that any of the reticle cassettes can be moved to a reticle pickup/release position of the robot 2. The robot 2 is able to move in a horizontal plane along the X, Y or Rz directions and is also able to move vertically. The robot 2 has a fork-like member 21 for supporting and transporting a reticle (indicated at 5 in FIG. 2). The reticle stage 4 includes reticle supports 41 for holding a reticle. The pre-alignment unit 3 is fixedly mounted on a base of the reticle stage 4. The pre-alignment unit 3 includes light sources 31 and PCB assemblies 32 (FIG. 3).

During operation of the reticle transfer apparatus, the robot 2 takes a reticle from the reticle carrier 1 and carries it to a position suitable for transferring it to the reticle stage 4. The position is under the pre-alignment unit 3, at which pre-alignment is carried out and the reticle stage 4 is finely adjusted in terms of tilt and/or position to eliminate deviations detected in the pre-alignment. As a result, it is suitable for the robot 2 to pass the reticle on to the reticle stage 4. After the reticle has been used, the robot 2 picks it up from the reticle stage 4 and transfers it into an empty reticle cassette in the reticle carrier 1.

Figure 2:
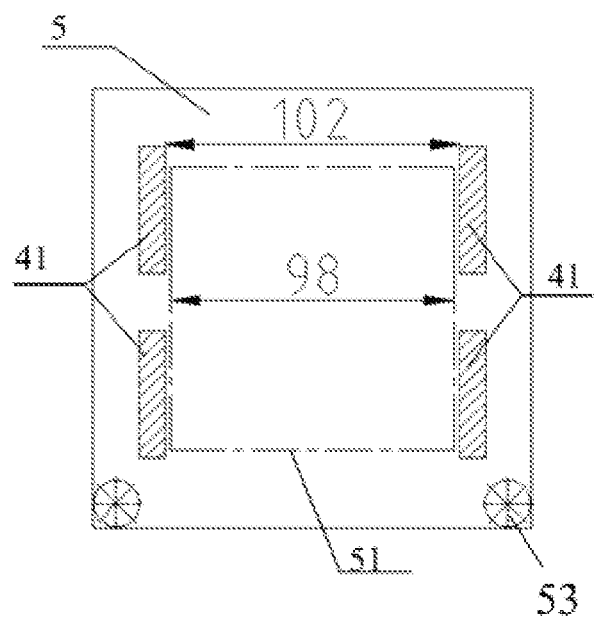
FIG. 2 is a diagram schematically illustrating a reticle stage and a reticle.
Figure 3:
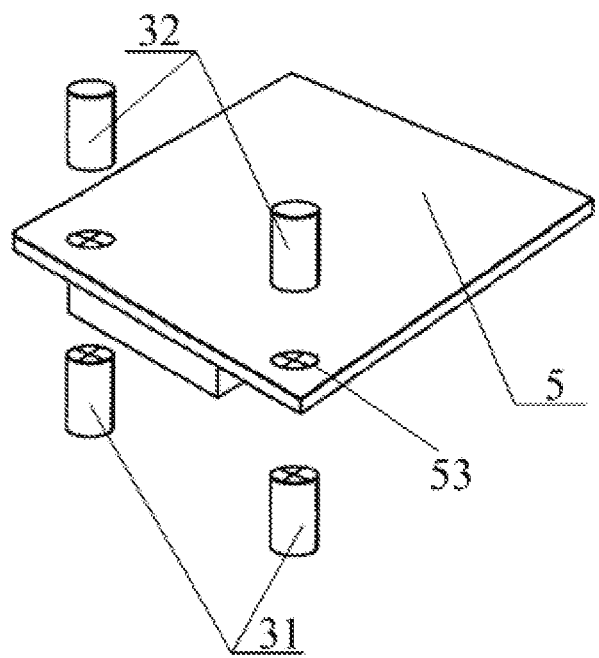
FIG. 3 is a diagram schematically illustrating pre-alignment of a reticle.

In general, a pellicle frame 51 is attached to an upper or lower side of the reticle, which, as shown in FIG. 2, partially enters a space delimited by the reticle supports 41 of the reticle stage, during the pre-alignment of the reticle 5 being held by the robot 2. Conventionally, the reticle supports 41 are spaced very close to the pellicle frame 51. For example, a spacing between the reticle supports 41 is 102 mm, while the pellicle frame 51 is 98 mm wide. For this reason, during the transfer of the reticle 5 onto the reticle stage, it is very likely for the pellicle frame 51 of the reticle 5 to collide with the reticle supports 41. This may happen even before the reticle 5 reaches the position under the pre-alignment unit 3 particularly when the fork-like member 21 of the robot 2 is titled at an excessive angle. If the pellicle frame 51 is damaged, the pattern on the reticle 5 may be contaminated and the reticle itself may thus have to be scrapped.

Optionally, a set of marks 53 may be formed in the reticle 5. During the pre-alignment of the reticle 5, as shown in FIG. 3, the reticle 5 is located so that the marks 53 are between the light sources 31 of the pre-alignment unit 3 and the PCB assemblies 32 thereof. The pre-alignment is considered to be successful if light beams from the light sources 31 pass through the marks 53 and are then received by the PCB assemblies 32. If the marks 53 are not between the light sources 31 and the PCB assemblies 32, then the PCB assemblies 32 cannot receive the light beams from the light sources 31, and the pre-alignment will not be considered to be successful.

Figure 4:
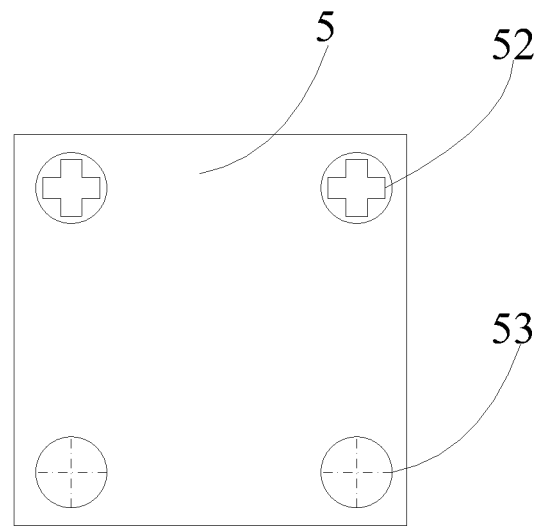
FIG. 4 is a structural schematic of a reticle according to the present invention.
Figure 5A:
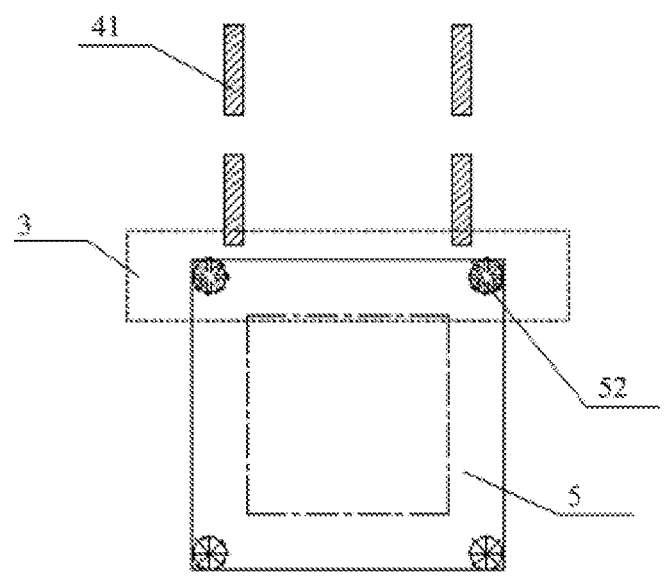
FIGS. 5A and 5B show a process for pre-alignment of a reticle in accordance with the present invention.
Figure 5B:
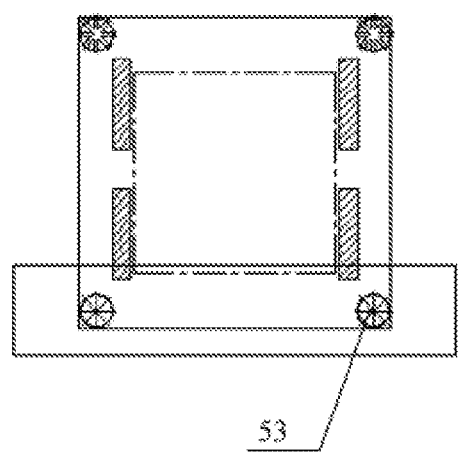

A solution proposed in the present invention for preventing the pellicle frame 51 from colliding with the reticle stage 4 is as shown in FIG. 4, in which another set of marks 52 is formed in the reticle 5. Optionally, the two set of marks 52 and 53 may be formed at the four corners of the reticle 5, with marks 52 or 53 in each set being located at adjacent corners rather than at diagonal corners. During the movement of the reticle 5 with the fork-like member 21 of the robot toward the position for transferring the reticle to the reticle stage 4, one set of marks 52 or 53 is closer to the reticle stage than the other (i.e., the other set is closer to the robot). In this embodiment, the marks 52 are closer to the reticle stage 4 than the marks 53. In other words, the side of the reticle on which the marks 52 are found approaches the reticle stage 4 first. FIGS. 5A and 5B shows a reticle pre-alignment process according to the present invention, in which the reticle 5 is moved until the marks 52 are located under the pre-alignment unit 3. A first pre-alignment step is then performed to detect deviations, based on which the reticle stage 4 is adjusted in terms of tilt and/or position under the control of a control unit (not shown), thereby preventing the reticle 5, in particular, the pellicle frame 51, from colliding with the reticle stage 4, in particular, the reticle supports 41. After that, the reticle 5 is further moved until the marks 53 are also located under the pre-alignment unit 3, and a second pre-alignment step is then formed based on the marks 53 to detect further deviations, based on which the reticle stage 4 is finely adjusted in terms of tilt and/or position under the control of the control unit such that the reticle 5 is positioned in a predetermined range relative to the reticle stage 4. Finally, the robot 2 passes the reticle 5 on to the reticle stage 4. In another embodiment, the control unit may control the robot based on the results of the first pre-alignment step so that the position of the reticle relative to the reticle stage is adjusted to prevent the reticle from colliding with the reticle stage and may control the robot based on the results of the second pre-alignment step so that the position of the reticle relative to the reticle stage is adjusted and the reticle is thus positioned in the predetermined range relative to the reticle stage. These two pre-alignment steps can prevent the pellicle frame 51 of the reticle 5 from colliding with the reticle supports 41 of the reticle stage 4 during the transfer of the reticle 5 to the reticle stage 4 by the robot, i.e., providing protection to the reticle 5, and also allows higher transfer accuracy.

Disclosed herein are merely several preferred particular embodiments of the present invention, which are intended to explain the subject matter thereof rather than limit the scope thereof. All embodiments made by those skilled in the art by unit of logical analysis, reference or limited experimentation based on the teachings of the invention are embraced within the scope thereof.

What is claimed is:
1. A reticle transfer apparatus, comprising a reticle, a reticle stage and a robot, the robot configured to support, transport and transfer the reticle onto the reticle stage, wherein the reticle transfer apparatus further comprises:
  a first set of marks and a second set of marks, both provided on the reticle;
  a pre-alignment unit, disposed on one side of the reticle stage and configured to perform a first pre-alignment process by detecting the first set of marks and perform a second pre-alignment process by detecting the second set of marks during transfer of the reticle; and
  a control unit, configured to adjust a position of the reticle relative to the reticle stage based on results of the first pre-alignment process such that the reticle is prevented from colliding with the reticle stage and to adjust a further position of the reticle relative to the reticle stage based on results of the second pre-alignment process such that the reticle is positioned in a predetermined range relative to the reticle stage.

2. The reticle transfer apparatus according to claim 1, wherein the reticle is provided with a pellicle frame, wherein the reticle stage comprises reticle supports, and wherein the control unit adjusts the position of the reticle relative to the reticle stage based on the results of the first pre-alignment process such that the pellicle frame of the reticle is prevented from colliding with the reticle supports of the reticle stage.

3. The reticle transfer apparatus according to claim 1, wherein the first set of marks is formed at two adjacent ones of four corners of the reticle, with the second set of marks formed at remaining two adjacent ones of the four corners of the reticle.

4. A reticle transfer method, comprising:
1) providing a reticle with a first set of marks and a second set of marks and moving the reticle so that the reticle is located under a pre-alignment unit, wherein the pre-alignment unit is disposed on one side of a reticle stage;
2) performing, by the pre-alignment unit, a first pre-alignment process by detecting the first set of marks;
3) adjusting, by a control unit, a position of the reticle relative to the reticle stage based on results of the first pre-alignment process such that the reticle is prevented from colliding with the reticle stage;
4) further moving the reticle and performing, by the pre-alignment unit, a second pre-alignment process by detecting the second set of marks; and
5) adjusting, by the control unit, a further position of the reticle relative to the reticle stage based on results of the second pre-alignment process such that the reticle is positioned in a predetermined range relative to the reticle stage.

5. The reticle transfer method according to claim 4, wherein the reticle is provided with a pellicle frame, wherein the reticle stage comprises reticle supports, and wherein in step 3) the control unit adjusts the position of the reticle relative to the reticle stage based on the results of the first pre-alignment process such that the pellicle frame of the reticle is prevented from colliding with the reticle supports of the reticle stage.

6. The reticle transfer method according to claim 4, wherein the first set of marks is formed at two adjacent ones of four corners of the reticle, with the second set of marks formed at remaining two adjacent ones of the four corners of the reticle.

* * * * *